United States Patent

Seyama et al.

[11] Patent Number: 6,057,168
[45] Date of Patent: May 2, 2000

[54] METHOD FOR FORMING BUMPS USING DUMMY WAFER

[75] Inventors: Kiyotaka Seyama; Hideki Ota; Yasuhiro Usui; Kazuaki Satoh, all of Kawasaki, Japan

[73] Assignee: Fujitsu Limited, Kawasaki, Japan

[21] Appl. No.: 09/237,897

[22] Filed: Jan. 27, 1999

[30] Foreign Application Priority Data

Apr. 10, 1998 [JP] Japan .................................. 10-099259

[51] Int. Cl.$^7$ ...................................................... H01L 21/44
[52] U.S. Cl. ........................ 436/616; 438/612; 438/613; 438/614
[58] Field of Search .................................... 438/616, 615, 438/613, 612

[56] References Cited

U.S. PATENT DOCUMENTS

| 5,219,117 | 6/1993 | Lin ........................................... 228/253 |
| 5,607,099 | 3/1997 | Yeh et al. ........................... 228/180.22 |
| 5,646,068 | 7/1997 | Wilson et al. . |
| 5,860,585 | 1/1999 | Rutledge et al. . |

FOREIGN PATENT DOCUMENTS

| 01189942 | 7/1989 | Japan . |
| 06275628 | 9/1994 | Japan . |

OTHER PUBLICATIONS

"Replacement of Missing Solder Balls by Transient Wetting Transfer", IBM Technical Disclosure Bulletin, vol. 39, No. 7, Jul. 1, 1996, pp. 281–282.

*Primary Examiner*—Kevin M. Picardat
*Assistant Examiner*—D. M. Collins
*Attorney, Agent, or Firm*—Armstrong, Westerman, Hattori, McLeland & Naughton

[57] ABSTRACT

A method for forming bumps including the steps of forming bumps on a dummy wafer. The dummy wafer is diced into dummy chips and the bumps formed on the dummy chips are inspected. Thus only good bumps are transferred to a real chip on which circuit patterns are formed.

9 Claims, 3 Drawing Sheets

METHOD FOR FORMING BUMPS USING DUMMY WAFER

BACKGROUND OF THE INVENTION

1. Field of the Invention

The present invention relates to a method for forming bumps and a semiconductor device obtained therefrom. Specifically, the present invention relates to a method, for forming bumps, using a transfer technology and capable of improving a yield of semiconductor devices, and a semiconductor device obtained therefrom.

2. Description of the Related Art

Recent semiconductor devices are adapted so that a surface of a semiconductor substrate, for example, of silicon on which circuit patterns are provided, is directly mounted to a corresponding surface of a printed circuit board in order to prevent signal transmission from being delayed and to ensure that the integration density is enhanced. For this purpose, projections called bumps are formed on electrodes of the semiconductor substrate, and the mounting of the semiconductor substrate onto the printed circuit board is carried out via the bumps, whereby the difference in height between the respective electrodes on the semiconductor substrate and between those on the printed circuit board is absorbed by the bumps.

Such bumps have been formed by a method called a wire-bonding. This, however, has a drawback in accordance with the increase in the number of terminals per chip in that the time and/or the cost for the production of bumps significantly increases because the bumps must be formed one by one in the wire-bonding method. Generally speaking, the cost for forming the bumps must be restricted in a range from 1 to 0.01% of that of a chip, and if the cost exceeds this allowable value, it is practically impossible to produce the semiconductor devices. To solve such a problem, in a case of a relatively large size chip, electrodes which have been formed solely in the peripheral area of the chip in the prior art are provided all over the chip to lower the installation density of the electrodes and increase the distance between adjacent electrodes. This allows forming bumps by vapor deposition, plating or printing which provide the bumps at once on all of the electrodes before a wafer is diced into individual semiconductor substrates carrying circuit patterns thereon, to result in a reduction in the production cost.

However, there has been a demand for forming bumps even on a chip having a smaller electrode pitch (i.e., a higher electrode density) due to the recent tendency to high performance and high density in semiconductor devices. In response thereto, a method for forming bumps using a transfer technology (hereinafter referred to a transfer method) has been proposed, for example, in Japanese Unexamined Patent Publication Nos. 1-189942 and 3-190138. When a vapor deposition, plating or printing method is used, it is necessary to select solder materials and production processes so that no adverse effect occurs on the semiconductor substrate, which means that the use of novel solder materials or novel production processes may be difficult.

For example, in a case of vapor deposition, materials are limited to those capable of being vapor-deposited, and a fluorine type gas, which damages a semiconductor substrate surface, is not usable. Also, in a case of plating, materials are limited to those capable of being plated, and a plating solution which damages a semiconductor substrate is not usable. In a case of printing, materials are limited to those capable of being printed, and a large pressure or a flux which damages a semiconductor substrate is not usable. Contrarily, according to the transfer method, such restrictions are eliminated, and it is possible to freely employ low cost materials or production processes and/or novel materials or production processes from which a high yield is achievable. As a result, bumps can be formed at high density by a transfer method while maintaining a favorable yield substantially equal to that of a semiconductor substrate having a low electrode density obtained by a conventional method such as a vapor deposition or others.

The production yield of the bumps is at most 99.999% even if the above-mentioned transfer method is used, which means that this method is usable for the production of chips of a highest specification now marketed, each having 1000 bumps, in view of the production cost, but is not applicable to the production of chips, each having 2000 to 8000 bumps. Further, if the transfer method is used for the production of chips having 10,000 bumps or more, such as those used for the research and development, the production yield per chip is at most 90%. Particularly, since the mass-production technique is hardly applicable to the production of the chips used for the research and development, the production cost becomes higher as well as the production yield becomes lower, and there is a case, for example, at an initial stage of the research, wherein only 1% of the products are non-defective. Under such circumstances, it is impossible to use the method having a yield of 90% for forming the bumps in view of cost and time required for the research.

The inventors of the present invention have found that a cause for lowering the yield of the products obtained by the transfer method resides in the formation of bumps prior to the transfer.

SUMMARY OF THE INVENTION

The object of the present invention is to solve the above-mentioned problems in the prior art by providing a method for forming bumps which has no problem in production cost even though it is applied to a chip having 1000 bumps or more, while maintaining a proper production yield of semiconductor devices as in the prior art, and a semiconductor device obtained therefrom.

According to the invention, a method for forming bumps comprises the steps of: forming bumps on a dummy wafer; dicing the dummy wafer into dummy chips; inspecting the bumps formed on the dummy chips; and transferring the bumps of the dummy chip passing an inspection onto a real chip on which circuit patterns are formed.

By adopting such constituent features, the production yield is improved because the bumps are inspected while they are maintained on the dummy chips so that only non-defective products are transferred to the real chips.

Preferably, the step for forming bumps on the dummy wafer is carried out by one selected from the group of methods comprising vapor deposition, electrolytic plating, electroless plating, printing and ball delivery. By adopting such constituent features, it is possible to form bumps in various manners.

Preferably, the bump is a solder bump, and the bump transferring step is carried out while heating and melting the solder bump; a material for forming the dummy wafer is one having such a thermal expansion coefficient that the difference in thermal expansion between the dummy wafer and the real chip measured at a temperature under which the solder bump is transferred and at a normal temperature is less than a pitch of the bump arrangement; and the material of the dummy wafer is not wettable by or reacts with the solder at a temperature under which the solder bump is molten. By adopting such constituent features, it is possible to prevent a positional shift of bumps, due to thermal expansion, from occurring when the bumps are transferred from the dummy chip to the real chip and to prevent the bumps from adhering to the dummy chip, whereby the transferring operation can be smoothly carried out.

Preferably, the bump is a solder bump, and the bump-forming step is carried out while heating the solder bump; a material for forming a mask used in the vapor deposition or the printing is one having such a thermal expansion coefficient that the difference in thermal expansion between the mask and the dummy wafer measured at a temperature at which the solder bump is formed while being heated and at a normal temperature is less than a pitch of the bump arrangement; and the material of the mask is not wettable by or reacts with the solder at a temperature at which the solder bump is formed. By adopting such constituent features, it is possible to prevent a positional shift of the bumps from occurring when the bumps are vapor-deposited or printed on the dummy wafer, and to prevent the solder from adhering to the mask.

Preferably, holes provided in the mask have a cross-sectional shape tapered in such a manner that a diameter on one side opposed to the dummy wafer is larger than that on the other side. Also, the holes provided in the mask are preferably chamfered on the side opposed to the dummy wafer. By adopting such constituent features, it is possible to prevend the bumps being removed together with the mask when the mask is released from the dummy wafer.

Preferably, in a case wherein a flux is used in the bump-transfer step, a solvent used in the flux has a boiling point lower than a melting point of the solder. By adopting such constituent features, it is possible to evaporate the solvent before the solder is molten and to prevent voids being generated in the solder bumps due to the solvent.

Preferably, in a case wherein a flux is used in the bump-transfer step, rosin used in the flux has a solidification point or a carbonization point higher than a melting point of the solder. According to such constituent features, it is possible to easily remove the rosin by a rinsing after the transfer.

A semiconductor device is also provided, wherein bumps are formed on a semiconductor chip by a method defined by any one of the above-described claims. By adopting such constituent features, it is possible to improve the production yield of the semiconductor devices having solder bumps.

BRIEF DESCRIPTION OF THE DRAWINGS

The present invention will become more apparent from the following description of the preferred embodiments, with reference to the accompanying drawings, in which.

DESCRIPTION OF THE PREFERRED EMBODIMENTS

Figure 1A:
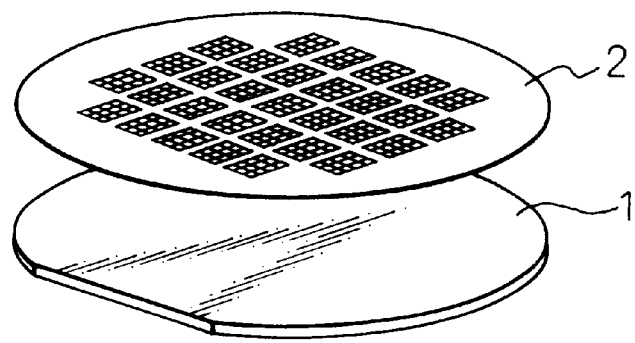
FIGS. 1A to 1C are views illustrating one embodiment of a method for forming bumps according to the present invention.

FIGS. 1A to 2C illustrate one embodiment of a method for forming bumps according to the present invention. According to this embodiment of a method for forming bumps, a mask 2 is positioned on a dummy wafer in position 1 which is to be temporarily used as shown in FIG. 1A, and solder is then vapor-deposited to the dummy wafer 1 in a vapor-deposition device. The dummy wafer 1 is formed from a material which has a thermal expansion coefficient closer to that of an actually used chip and which is not wettable to nor reacts with solder at a temperature at which the solder is molten.

For example, if the actually used chip is made of Si, the most favorable material for the dummy wafer 1 is Si, but other material such as glass having a thermal expansion coefficient close to that of Si, ceramics such as AlN or SiC, or metal such as molybdenum or 42 alloy (Fe/Ni alloy) may be used. Also, metal having a thermal expansion coefficient close to that of Si, and coated with $SiO_2$ or $Si_3N_4$ may be used, wherein the surface-coating is not molten nor reacts with the solder at a temperature at which the solder is molten, even if the metal is not molten at a temperature at which the solder is molten but the solder may be adhered to the metal or the metal may react with the solder.

The mask 2 has a thickness in the range from 50 to 100 $\mu$m and is perforated in correspondence with a plurality of chips actually used and at positions corresponding to the positions of bumps on the respective chips. A material used for the mask 2 is one which has a thermal expansion coefficient closer to that of the actually used chip and which is not wettable by nor reacts with solder at a temperature under which the solder is molten.

For example, if the really used chip is made of Si, the most favorable material for the mask 2 is also Si, but other material such as glass having a thermal expansion coefficient close to that of Si, ceramics such AlN or SiC or, metal such as molybdenum or 42 alloy (Fe/Ni alloy) may be used. Also, metal having a thermal expansion coefficient close to that of Si, and coated with an inorganic film such as $SiO_2$ or an organic film such as polyimide may be used, wherein the surface-coating is not molten, not wettable nor reacts with the solder at a temperature at which the solder is molten, even if the metal is not molten at a temperature at which the solder is molten but the metal is wettable by or reacts with the solder.

Also, in the above-mentioned materials for the mask, it is preferable to use a material having a magnetic property or coated with a material having a magnetic property. The mask made of a material having a magnetic property is capable of being brought into close contact with the surface of the dummy wafer if a magnet is located beneath the dummy wafer.

Figure 1B:
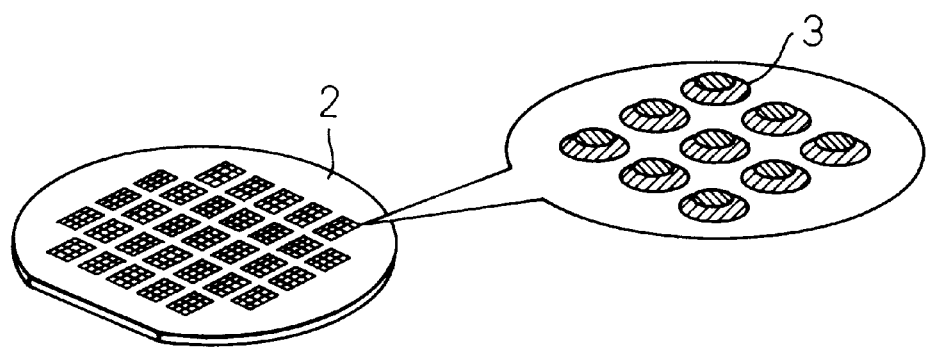
Figure 1C:
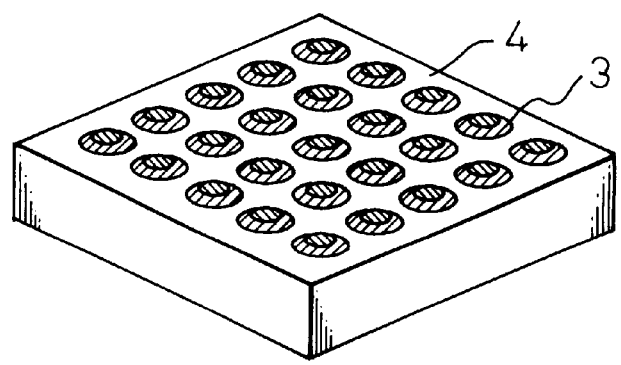

Solder bumps 3 in a frustro-conical shape (hereinafter referred to as fixed solders) are formed on the dummy wafer 1, as illustrated in FIG. 1B after the solder is vapor-deposited through the mask 2. Next, the wafer 1 on which the fixed solders 3 are formed is diced into dummy chips 4, as illustrated in FIG. 1C. The respective diced dummy chips 4 are then inspected to examine whether the fixed solders 3 thereof are good or not. Defective dummy chips such as those having variance in height of the fixed solders, dust stuck thereon or bridges are removed. The inspection may be carried out prior to the dicing, and the defective dummy chips may be picked up after the dicing. In this regard, the present invention should not be limited to the order of these steps, but it should be considered that these steps are included.

Figure 2A:
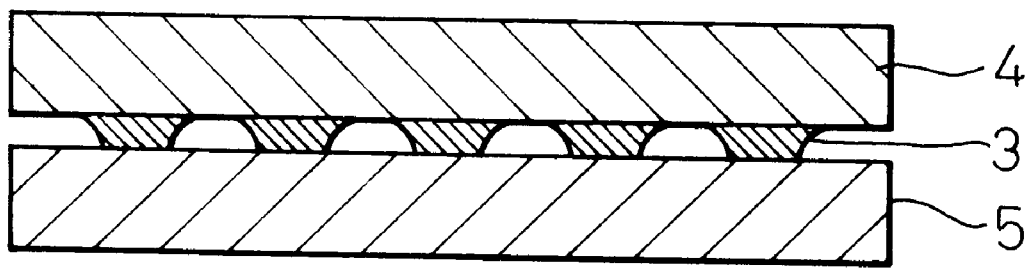
FIGS. 2A to 2C are views illustrating another embodiment of a method for forming bumps according to the present invention.
Figure 2B:
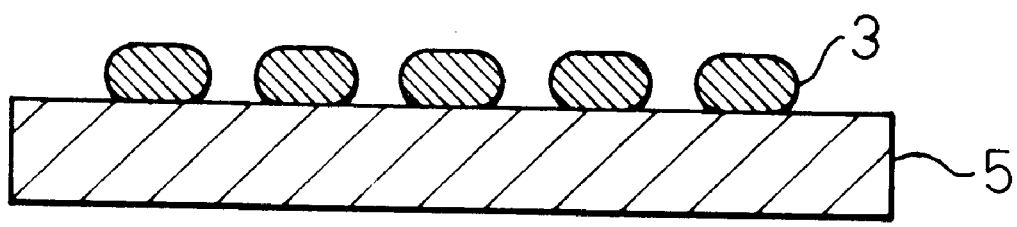
Figure 2C:
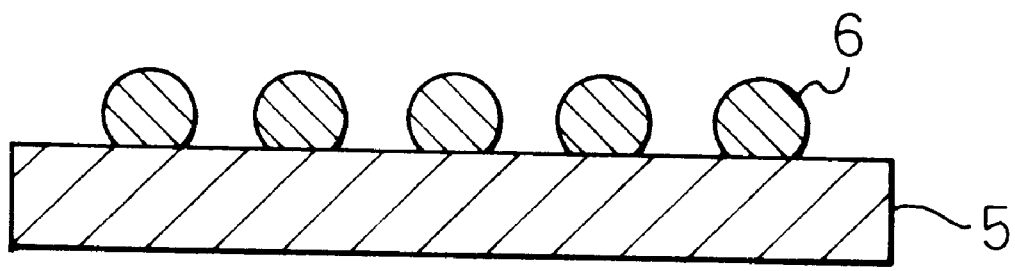

The selected good dummy chips 4 are placed on really used chips 5 with the fixed solders 3 directed downward so that the fixed solders 3 are arranged on the positions on the real chips 5 at which the bumps are to be formed, as shown in FIG. 2A. The assembly is then heated to melt the fixed solders 3. Thereby, the fixed solders 3 are released from the dummy chip 4 having a property which is not wettable to the solder and move to the real chip 5. That is, the fixed solders 3 are transferred from the dummy chip 4 to the real chip 5. After being cooled, the dummy chip 4 is removed while maintaining the fixed chips 3 on the real chip 5, as shown in FIG. 2B. If the real chip 5 is heated again, the fixed solders 3 are molten to have a ball shape due to a surface tension thereof, as shown in FIG. 2C. Thus, the bumps 6 are formed.

In the method for forming bumps according to the present invention thus constituted, the solder bumps 6 are not formed directly on the real chip 5 but the fixed solders 3 are provided on the dummy wafer 1 which is then divided into the dummy chips 4. Defective dummies are removed chips carrying unfavorable fixed solders 3. Since the fixed solders 3 are transferred from the remaining good dummy chips 4 to the real chips 5, there are no defective bumps on the real chips 5, with the result that the production yield of semiconductor devices with solder bumps is improved.

Since the dummy wafer 1 is made of a material which has a thermal expansion coefficient closer to that of the really used chip 5 and which is not wettable to or reacts with the solder at a temperature under which the solder is molten, such as glass, ceramics or metal, there is no positional shift between the dummy chip 4 and the real chip 5 when heated to a melting point of the solder during the transferring of the fixed solders 3 to the real chips 5.

Since the bumps are not directly formed on the real chip 5, it is possible to freely select the material and/or process for the dummy wafer 1 within the above-mentioned limitation, including a low cost material and a material durable to a special process for forming solder bumps which may not be applicable to the real chips. For example, an α-free solder or a special alloy solder may be adopted at low cost and without the limitation of the real chip.

Also the solder bumps may not be completely transferred from the dummy chip to the real chip 5 if the dummy wafer 1 is wetted by the solder in the transfer process, but if the surface of the dummy wafer is coated with a material such as inorganic film or organic film which is not wettable by the solder, it is possible to use a material which is wettable by the solder for forming the dummy wafer.

Since the material which is not wetted by or reacts with the solder at a temperature at which the solder is molten, and has a thermal expansion coefficient closer to that of the really used chip 5, is used for forming the mask 2, it is possible to prevent the mask from adhering to the fixed solders 3 and to avoid the fixed solders 3 from shifting due to the difference in thermal expansion from the dummy wafer 1.

Figure 3A:
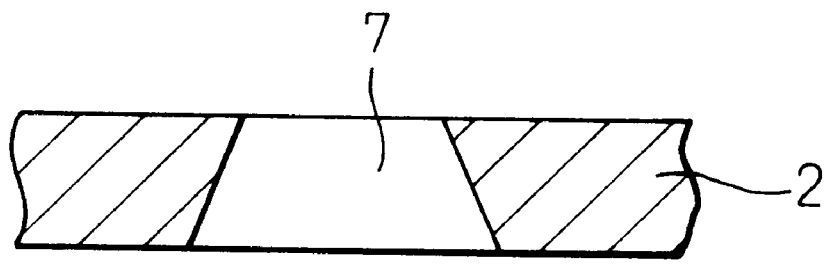
FIGS. 3A to 3C are views illustrating a mask used in the method for forming bumps according to the present invention.
Figure 3B:
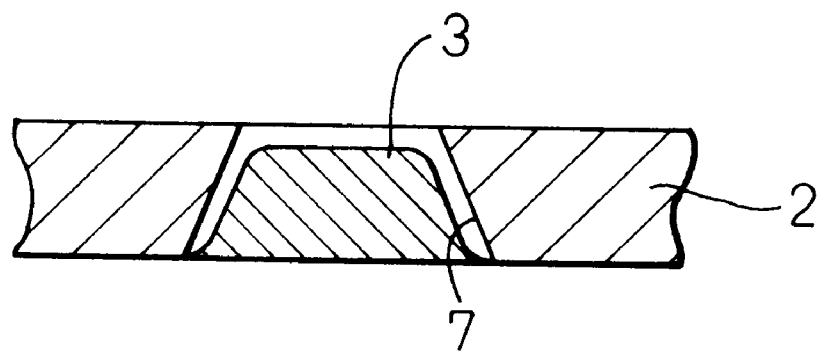
Figure 3C:
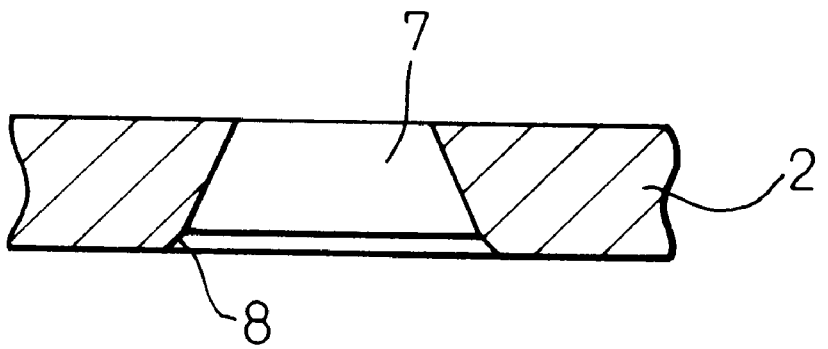

In this regard, if the holes 7 of the mask 2 have a frustro-conical shape, as shown in FIG. 3A, it is possible to easily detach the mask 2 from the dummy wafer 1 without damaging the fixed solders 3 after the fixed solders have been formed. Also, if a chamfer 8 is provided in the frustro-conical hole 7 on the side at which the mask 2 contacts the dummy wafer 7, as shown in FIG. 3C, so the detaching of the mask is facilitated. A taper angle of the frustro-conical hole 7 is preferably in the range from 70 to 89 degrees relative to the surface of the mask to be in contact with the dummy wafer.

Next, another embodiment of a method for forming bumps according to the present invention will be described below. This embodiment is similar to the former embodiment except that fixed solders 3 are formed on the dummy wafer 1 by a printing method. Accordingly, the dummy wafer 1 and the mask 2 are made of the same materials as those used in the former embodiment. The mask 2 is placed on the dummy wafer 1, and a solder paste is applied thereon by a screen printing. After the mask 2 is removed, the dummy wafer 1 is heated to form the fixed solders 3.

Then, the dummy wafer 1 is diced into individual dummy chips 4 which are inspected to examine whether the fixed solders 3 are good or defective. After the defective dummy chips have been removed, only the fixed solders 3 on the non-defective dummy chips are transferred to the real chips 5 which are then heated again to form bumps 6 in the same manner as in the former embodiment. According to this embodiment for forming the bumps as described above, it is possible to improve the production yield of chips with bumps. If a hole 7 of the mask 2 is of a frustro-conical shape and provided with a chamfer 8 along the lower edge thereof, it is possible to detach the mask without damaging the printed solders as described with reference to the former embodiment.

A further embodiment of a method for forming bumps according to the present invention will be described below. This embodiment is almost the same as the former embodiment except that fixed solders 3 are formed by a known electroplating method, an electroless plating method or a ball delivery method. As in the former embodiment, it is possible to improve the production yield of chips with bumps.

In each of the above-mentioned embodiments, when the fixed solders 3 are transferred from the dummy chip 4 to the real chip 5 while using a flux, preferably, a solvent used in the flux has a boiling point lower than a melting point of the solder, and a resin used in the flux has a solidification point or carbonization point higher than a melting point of the solder. The reason therefor is in that if the boiling point of the solvent is higher than the melting point of the solder, the solvent is left even if the solder has been molten, which gasifies and enters the molten solder, causing voids in the transferred bump; while, if the solidification point and the carbonization point of the resin is lower than the melting point of the solder, the resin cannot be removed from the fixed solder by a rinsing or others after the same is transferred.

The semiconductor device according to the present invention has bumps formed on a semiconductor chip by either of the above-mentioned embodiments of a method for forming bumps. Since the fixed solders to be bumps are inspected so that the dummy chips carrying defective bumps are removed during the production process, so the production yield of the bumps reaches 99.9999999% which exceeds 99.999999%, whereby the production yield of semiconductor chips, each having 11,700 bumps, becomes 95% which is a target of the present invention.

According to a method for forming bumps of the present invention and a semiconductor device obtained therefrom, fixed solders are inspected at a stage wherein the same are formed on dummy chips by vapor deposition, plating, printing or others, and the fixed solders on non-defective dummy chips only are transferred to real chips. Therefore, it is possible to reduce the number of defective bumps and improve the production yield of semiconductor devices to a greater extent. Also, since the bumps are not directly formed on the real chips, it is possible to use novel solder materials and/or novel production processes.

What is claimed is:

1. A method for forming bumps, comprising the steps of:

forming bumps on a dummy wafer;

dicing the dummy wafer to form dummy chips;

inspecting the bumps formed on the dummy chips; and transferring the bumps of the dummy chips passing the inspection onto real chips on which circuit patterns are formed.

2. A method for forming bumps as defined by claim 1, wherein the step for forming bumps on the dummy wafer is carried out by a method selected from the group consisting of vapor deposition, electrolytic plating, electroless plating, printing and ball delivery.

3. A method for forming bumps as defined by claim 1, wherein the bumps are solder bumps, and the bump transferring step is carried out while heating and melting the solder bump;

a material for forming the dummy wafer is one having such a thermal expansion coefficient that a difference in thermal expansion between the dummy wafer and the real chips, measured at a temperature at which the solder bumps are transferred and at a normal temperature, is less than a pitch of the bumps; and the material of the dummy wafer is not wettable by or reacts with the solder at a temperature at which the solder bumps are molten.

4. A method for forming bumps as defined by claim 2, wherein the bumps are solder bumps, and the bump forming step is carried out while heating the solder bumps;

a material for forming a mask used in the vapor deposition or the printing is one having such a thermal expansion coefficient that a difference in thermal expansion between the mask and the dummy wafer, measured at a temperature under which the solder bumps are formed while being heated and at a normal temperature, is less than a pitch of the bumps; and the material of the mask is not wettable by or reacts with the solder at a temperature at which the solder bumps are formed.

5. A method for forming bumps as defined by claim 4, wherein holes provided in the mask have a cross-sectional shape tapered in such a manner that a diameter on one side opposed to the dummy wafer is larger than that on the other side.

6. A method for forming bumps as defined by claim 5, wherein the holes provided in the mask are chamfered on the side opposed to the dummy wafer.

7. A method for forming bumps as defined by claim 1, wherein in a case wherein a flux is used in the bump-transfer step, a solvent used in the flux has a boiling point lower than a melting point of the solder.

8. A method for forming bumps as defined by claim 1, wherein in a case wherein a flux is used in the bump-transfer step, rosin used in the flux has a solidification point or a carbonization point higher than a melting point of the solder.

9. A method for forming bumps as defined by claim 1, wherein the bumps are formed on a flat surface of the dummy wafer.

* * * * *